(12) United States Patent
Krutko et al.

(10) Patent No.: US 8,901,657 B1
(45) Date of Patent: Dec. 2, 2014

(54) INTEGRATED CAPACITOR HAVING AN OVERHANGING TOP CAPACITOR PLATE

(75) Inventors: Oleh Krutko, Colleyville, TX (US); Larry Witkowski, Plano, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 1486 days.

(21) Appl. No.: 12/541,766

(22) Filed: Aug. 14, 2009

(51) Int. Cl.
*H01L 29/92* (2006.01)
*H01L 27/08* (2006.01)
*H01L 49/02* (2006.01)

(52) U.S. Cl.
CPC ............ *H01L 28/40* (2013.01); *H01L 27/0805* (2013.01)
USPC ............ 257/352; 361/303; 257/295; 257/306

(58) Field of Classification Search
CPC ..... H01L 28/40; H01L 27/0805; H01L 28/60; H01L 28/86
USPC ........................... 257/295, 306, 532; 361/303
See application file for complete search history.

(56) References Cited

U.S. PATENT DOCUMENTS

| | | | |
|---|---|---|---|
| 5,392,189 A * | 2/1995 | Fazan et al. | 361/305 |
| 5,439,849 A | 8/1995 | McBride | |
| 5,593,925 A | 1/1997 | Yamaha | |
| 6,316,820 B1 | 11/2001 | Schmitz | |
| 6,566,736 B1 | 5/2003 | Ogawa | |
| 7,326,990 B2 * | 2/2008 | Mikawa et al. | 257/310 |
| 2004/0081811 A1 * | 4/2004 | Casper et al. | 428/209 |
| 2005/0051819 A1 * | 3/2005 | Moon et al. | 257/295 |
| 2005/0212029 A1 * | 9/2005 | Yamamoto | 257/306 |
| 2006/0290421 A1 * | 12/2006 | Ichitsubo et al. | 330/66 |
| 2010/0044831 A1 * | 2/2010 | Guegan | 257/532 |

FOREIGN PATENT DOCUMENTS

JP 2002222934 * 9/2002 ............ H01L 27/108

* cited by examiner

*Primary Examiner* — Matthew Reames
*Assistant Examiner* — John Bodnar
(74) *Attorney, Agent, or Firm* — Schwabe Williamson & Wyatt

(57) ABSTRACT

Embodiments include but are not limited to apparatuses and systems including an integrated capacitor. An integrated capacitor may include a substrate, a first capacitor plate having four edges, and a second capacitor plate overhanging the four edges of the first capacitor plate and disposed over the first capacitor plate such that the first capacitor plate is disposed between the second capacitor plate and the substrate.

14 Claims, 7 Drawing Sheets

INTEGRATED CAPACITOR HAVING AN OVERHANGING TOP CAPACITOR PLATE

TECHNICAL FIELD

Embodiments of the present disclosure relate generally to microelectronic devices and more particularly to an integrated capacitor having an overhanging top capacitor plate.

BACKGROUND

Many of the devices in today's electronics are passive components such as resistors, inductors, and capacitors. For size, cost, and performance reasons, the passive components are commonly integrated onto a substrate and packaged with other passive components, as well as with active components.

Passive devices may be subject to performance degradation or failure in the event of moisture intrusion. If moisture penetrates the space between the top and bottom metal plates of a capacitor, for example, a leakage path may result. Moisture intrusion may be experienced by various types of packages, but non-hermetic packages may be particularly susceptible, in that the integrated capacitor may be directly exposed to a humid environment. High operating voltage and poor adhesion between metal and protective overcoat may further increase the likelihood of moisture-related failures.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The phrase "formed on," along with its derivatives, may be used herein. "Formed on" in the context of "a layer being formed on another layer" may mean that a layer is formed above, but not necessarily in direct physical or electrical contact with, another layer, e.g., there may be one or more other layers interposing the layers. In some embodiments, however, "formed on" may mean that a layer is in direct physical contact with at least a portion of a surface of another layer.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

Figure 1:
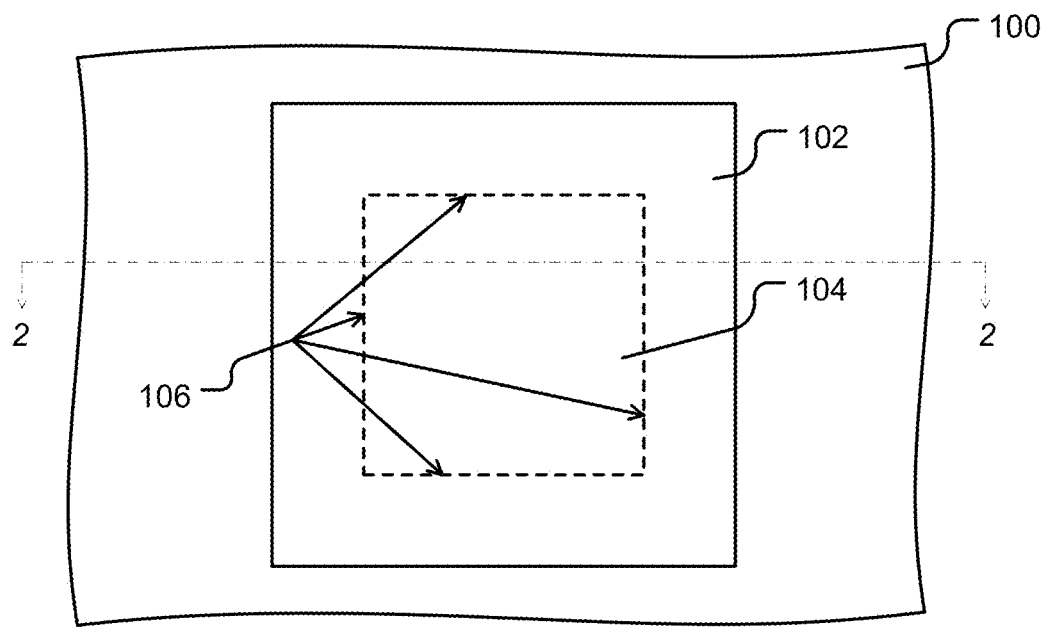
FIG. 1 is a top view of an integrated capacitor structure having an overhanging top capacitor plate in accordance with various embodiments.
Figure 2:
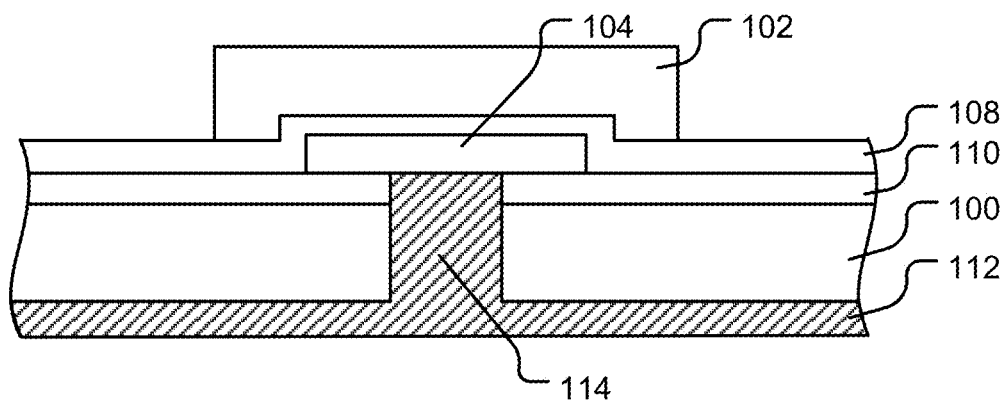
FIG. 2 is a sectional view of the capacitor structure of FIG. 1 in accordance with various embodiments.

FIG. 1 illustrates a top view of an integrated capacitor structure in accordance with various embodiments, while FIG. 2 illustrates a sectional side view of the integrated capacitor structure of FIG. 1. The capacitor structure includes a top capacitor plate 102 and a bottom capacitor plate 104 formed on a substrate 100. As illustrated, the top capacitor plate 102 overhangs the four edges 106 of the bottom capacitor plate 104. With this structure, the top capacitor plate 102 may in effect form, at least in part, an encapsulating structure to provide increased barrier protection from moisture reaching the area between the top capacitor plate 102 and the bottom capacitor plate 104. In various embodiments, the increased barrier protection may result in increased reliability of the capacitor structure.

The capacitor structure may be integrated on the substrate 100 with any one or more of various types of active devices.

Various transistors, for example, may be formed on the substrate 100 along with the capacitor structure. Transistors may include one or more of various field-effect transistors (FET) and/or bipolar junction transistors (BJT). Examples of FETs may include a high electron mobility transistor (HEMT) (e.g., an aluminum gallium nitride (AlGaN)/gallium nitride (GaN) HEMT), a pseudomorphic HEMT (pHEMT) (e.g., a gallium arsenide (GaAs) pHEMT), a metamorphic HEMT (mHEMT) (e.g., a GaAs mHEMT), a laterally diffused metal oxide semiconductor transistor (LDMOS), or a metal epitaxial semiconductor field effect transistor (MESFET). Examples of HBTs may include a heterojunction bipolar transistor (e.g., an indium gallium phosphide (InGaP)/GaAs HBT, or a silicon-germanium (SiGe) HBT).

The substrate 100 may comprise any material suitable for the application. For various embodiments, for example, the substrate 100 comprises GaAs. In other embodiments, however, the substrate 100 may comprise GaN. Another material or combination of materials may be similarly suitable. For example, the substrate 100 may comprise silicon carbide, silicon, sapphire, aluminum nitride, or some combination thereof or some combination with another suitable material.

In various embodiments, the capacitor structure may be a shunt metal-insulator-metal capacitor. To that end, the capacitor structure may include a capacitor dielectric layer 108 between the top capacitor plate 102 and the bottom capacitor plate 104. In some of these embodiments, the top capacitor plate 102, the capacitor dielectric layer 108, and the substrate 100 may cooperatively encapsulate the bottom capacitor plate 104. The shunt aspect may be realized by including an electrically-grounded metal layer 112 on the backside of the substrate 100, and connecting the metal layer 112 to the bottom capacitor plate 104 by a substrate via 114 filled with a conductive material.

The capacitor structure may include one or more additional dielectric layers. For example, the capacitor structure may include a dielectric layer 110 disposed between the substrate 100 and the bottom capacitor plate 104. In various embodiments, the dielectric layer 110 may be configured to isolate the substrate 100 from the capacitor structure and/or to add further barrier protection from moisture penetration.

Figure 3:
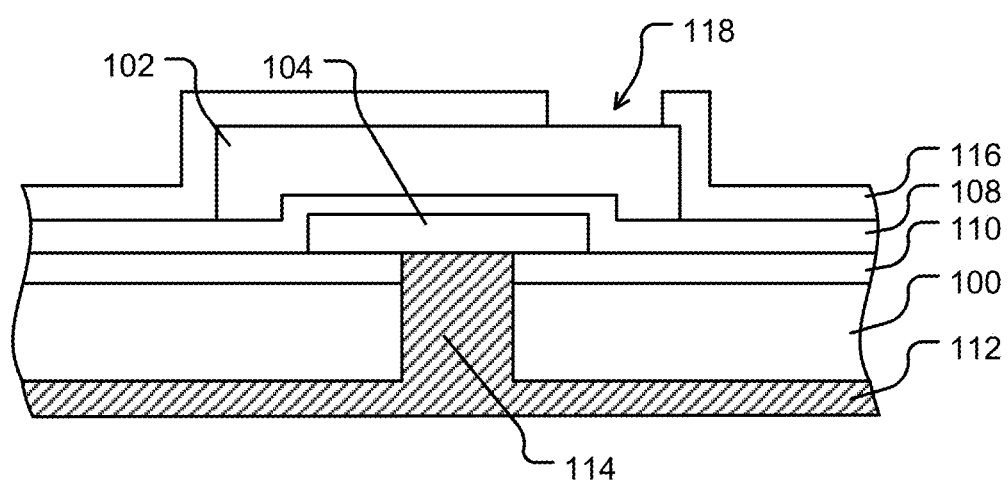
FIG. 3 is a sectional view of another capacitor structure having an overhanging top capacitor plate in accordance with various embodiments.

In various embodiments, the capacitor structure may also include another dielectric layer 116 covering the top capacitor plate 102, as illustrated in FIG. 3. In various embodiments, the dielectric layer 116 may be configured to protect the top capacitor plate 102 from exposure and/or to add further barrier protection from moisture penetration. As illustrated, the dielectric layers 108, 110, 116, and the top capacitor plate 102 may be configured to encapsulate the bottom capacitor plate 104.

Although the dielectric layer 116 covers the top capacitor plate 102, an opening 118 in the dielectric layer 116 may be provided. In various embodiments, the opening 118 may allow for electrically connecting to the top capacitor plate 102.

Figure 4:
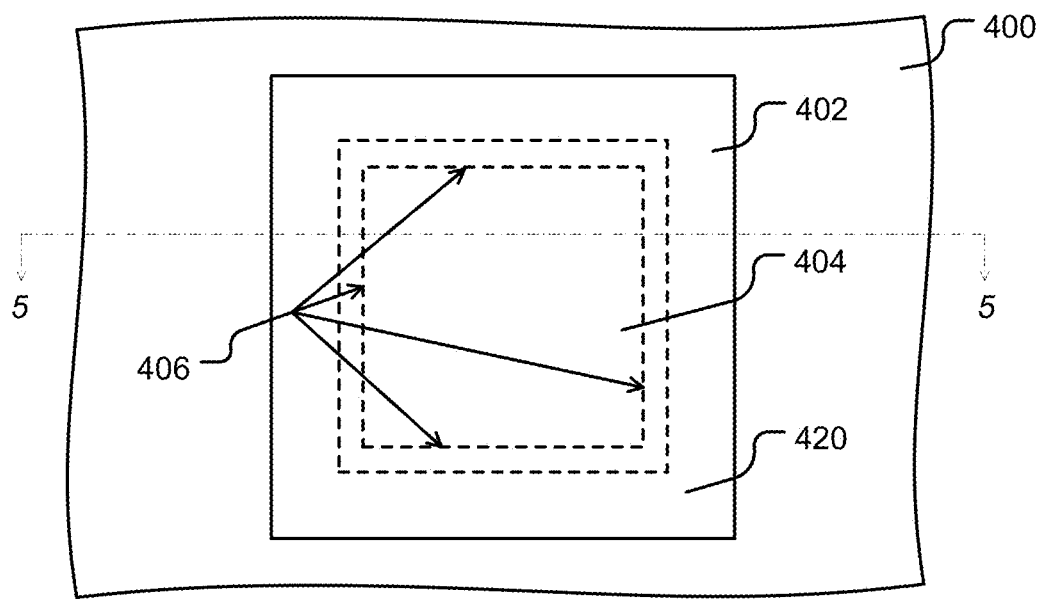
FIG. 4 is a top view of another integrated capacitor structure having an overhanging top capacitor plate in accordance with various embodiments.
Figure 5:
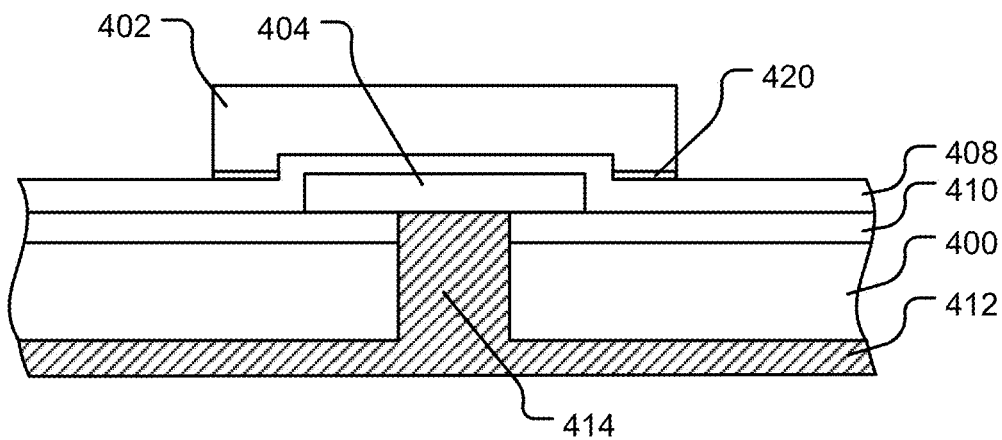
FIG. 5 is a sectional view of the capacitor structure of FIG. 4 in accordance with various embodiments.

FIGS. 4 and 5 illustrate another embodiment of a capacitor structure. FIG. 4 illustrates a top view of an integrated capacitor structure in accordance with various embodiments, while FIG. 5 illustrates a sectional side view of the integrated capacitor structure of FIG. 4. As illustrated, the capacitor structure includes some of the features of the capacitor structure described with respect to FIGS. 1-3, including, for example, a top capacitor plate 402 and a bottom capacitor plate 404 formed on a substrate 400, wherein the top capacitor plate 402 overhangs the four edges 406 of the bottom capacitor plate 404.

The capacitor structure illustrated in FIG. 4 may also be a shunt metal-insulator-metal capacitor. To that end, the capacitor structure may include a capacitor dielectric layer 408 between the top capacitor plate 402 and the bottom capacitor plate 404. The top capacitor plate 402, the capacitor dielectric layer 408, and the substrate 400 may cooperatively encapsulate the bottom capacitor plate 404. The shunt aspect may be realized by including an electrically-grounded metal layer 412 on the backside of the substrate 400, and connecting the metal layer 412 to the bottom capacitor plate 404 by a substrate via 414 filled with a conductive material.

The capacitor structure may include one or more additional dielectric layers. For example, the capacitor structure may include a dielectric layer 410 disposed between the substrate 400 and the bottom capacitor plate 404. In various embodiments, the dielectric layer 410 may be configured to isolate the substrate 400 from the capacitor structure and/or to add further barrier protection from moisture penetration. Although not illustrated, the capacitor structure may also include another dielectric layer covering the top capacitor plate 402 (see, for example, the dielectric layer 116 illustrated in FIG. 3).

The capacitor structure may further include a metal layer 420 disposed on a periphery of the bottom surface of the top capacitor plate 402. In various embodiments, the metal layer 420 may add further barrier protection from moisture penetration. The material used for forming the metal layer 420 may depend on the material used for forming the top capacitor plate 402. For example, the metal layer 420 may comprise a metal selected to have suitable adhesion to the top capacitor plate 402 and to the dielectric layer 408. Although a number of different materials may be suitable, example materials for the metal layer 420 may include one or more of titanium, titanium-tungsten, or nickel.

As discussed herein, the capacitor structure embodiments of FIGS. 1-5 are shunt capacitors. Embodiments of the present disclosure are not limited, however, to shunt capacitors. FIGS. 6-9 illustrate example embodiments of series capacitors.

Figure 6:
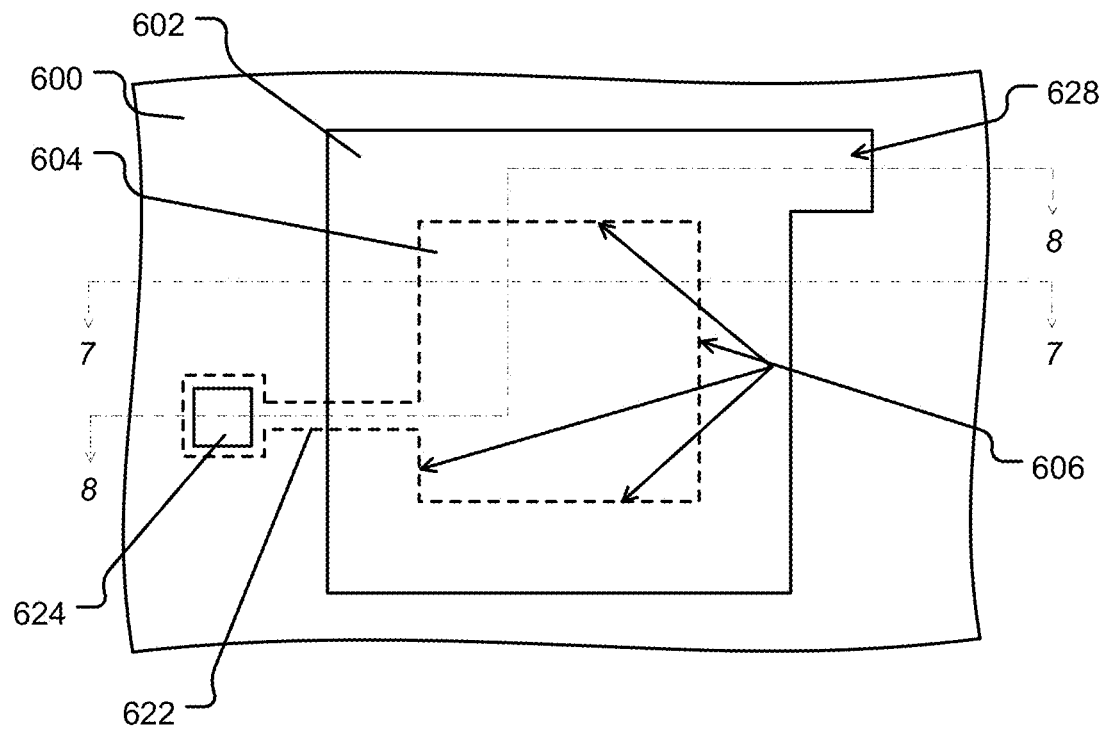
FIG. 6 is a top view of another integrated capacitor structure having an overhanging top capacitor plate in accordance with various embodiments.
Figure 7:
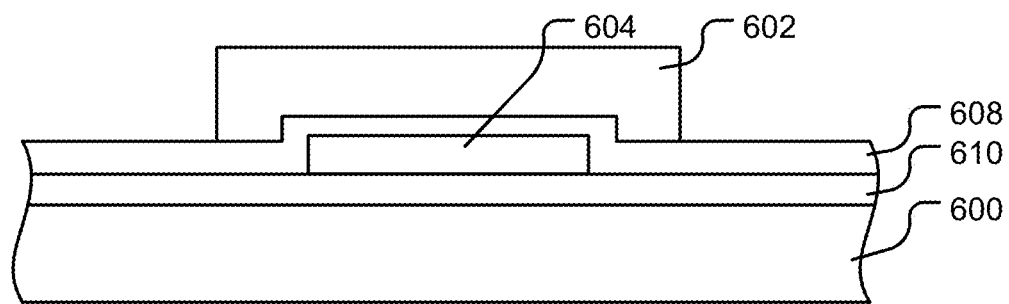
FIG. 7 is a sectional view of the capacitor structure of FIG. 6 in accordance with various embodiments.
Figure 8:
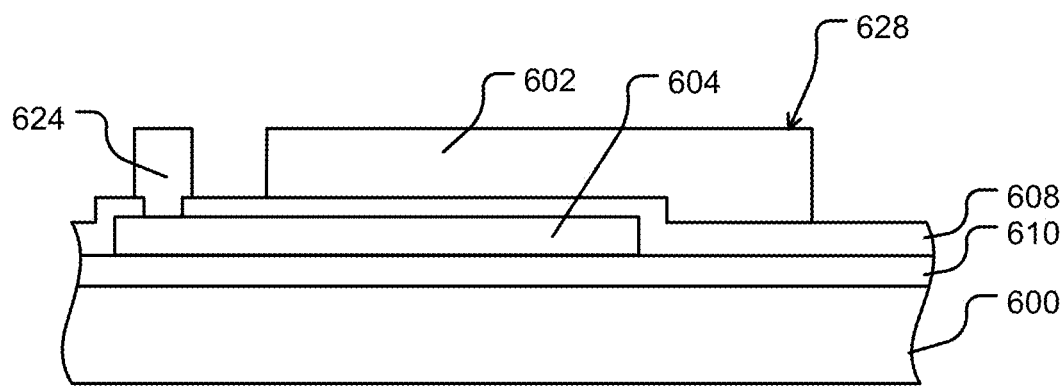
FIG. 8 is another sectional view of the capacitor structure of FIG. 6 in accordance with various embodiments.

FIG. 6 illustrates a top view of a series integrated capacitor structure in accordance with various embodiments, while FIGS. 7 and 8 illustrate sectional side views of the integrated capacitor structure of FIG. 6. As illustrated, the capacitor structure includes some of the features of the capacitor structure described with respect to FIGS. 1-5, including, for example, a top capacitor plate 602 and a bottom capacitor plate 604 formed on a substrate 600, wherein the top capacitor plate 602 overhangs the four edges 606 of the bottom capacitor plate 602.

As illustrated, the capacitor structure illustrated in FIGS. 6-9 is a metal-insulator-metal capacitor. To that end, the capacitor structure may include a capacitor dielectric layer 608 between the top capacitor plate 602 and the bottom capacitor plate 604. The top capacitor plate 602, the capacitor dielectric layer 608, and the substrate 600 may cooperatively encapsulate the bottom capacitor plate 604.

Figure 9:
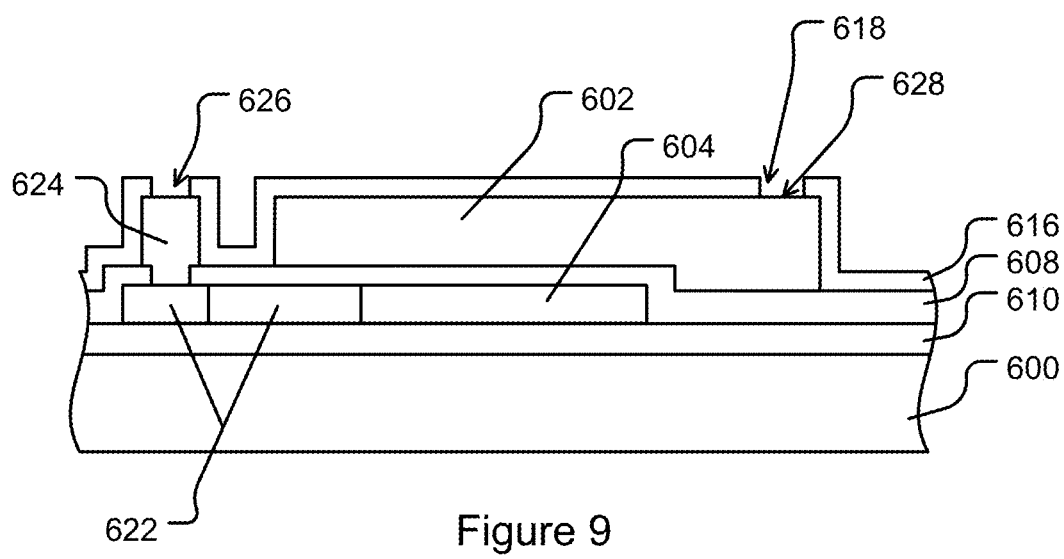
FIG. 9 is a sectional view of another capacitor structure having an overhanging top capacitor plate in accordance with various embodiments.

The capacitor structure may include one or more additional dielectric layers. For example, the capacitor structure may include a dielectric layer 610 disposed between the substrate 600 and the bottom capacitor plate 604. In various embodiments, the dielectric layer 610 may be configured to isolate the substrate 600 from the capacitor structure and/or to add further barrier protection from moisture penetration. As illustrated in FIG. 9, the capacitor structure may also include another dielectric layer 616 covering the top capacitor plate

602. An opening 618 in the dielectric layer 616 may be provided to allow for electrically connecting to the top capacitor plate 602.

For connecting the capacitor structure with one or more other capacitor structures and/or circuit elements (not illustrated), the capacitor structure may further include a connector 622 connecting the bottom capacitor plate 604 to a contact pad 624. For connecting to the top capacitor plate 402, an opening 618 in the dielectric layer 616 may be provided. Another opening 626 may be provided in the dielectric layer 616 for connecting to the contact pad 624. In various embodiments, the top capacitor plate 602 may be configured to include an extension 628 for connecting thereto. In various other embodiments, the extension 628 may be omitted (see, for example, the embodiment illustrated in FIG. 3).

Although not illustrated, a metal layer may also be disposed on a periphery of the bottom surface of the top capacitor plate 602 for adding further barrier protection from moisture penetration (see, for example, the metal layer 420 illustrated in FIGS. 4 and 5).

Figure 10:
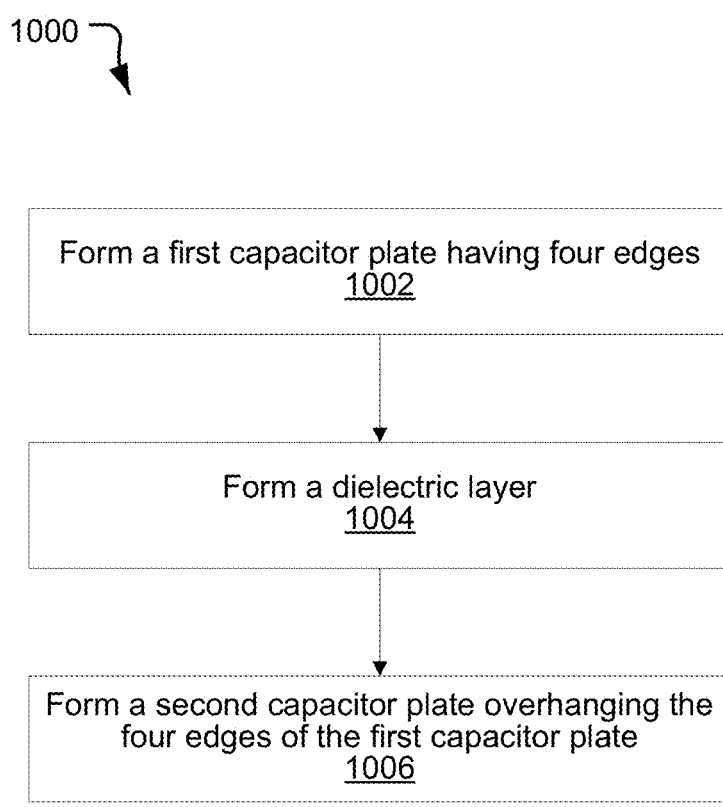
FIG. 10 is a flow diagram of some of the operations associated with making an integrated capacitor structure in accordance with various embodiments.

Turning now to FIG. 10, illustrated is a flow diagram of some of the operations associated with an example method 1000 of making an integrated capacitor structure in accordance with various embodiments described herein. It should be noted that although the method 1000 is illustrated as a series of sequential steps, the method is not necessarily order dependent. Moreover, methods within the scope of this disclosure may include more or fewer steps than that illustrated in FIG. 10.

According to various embodiments, a first capacitor plate having four edges may be formed at block 1002. The first capacitor plate may be formed on a substrate. The first capacitor plate may be a bottom capacitor plate as described elsewhere herein. In some embodiments, a connector may be formed to connect the first capacitor plate to a contact pad (not illustrated).

At block 1006, a second capacitor plate may then be formed overhanging the four edges of the first capacitor plate and disposed over the first capacitor plate such that the first capacitor plate is disposed between the second capacitor plate and the substrate. The second capacitor plate may be a top capacitor plate as described elsewhere herein. In various embodiments, a dielectric layer may be formed between the first capacitor plate and the second capacitor plate at block 1004. In some embodiments, forming the second capacitor may include forming a metal layer on a periphery of a bottom surface of the first capacitor plate (not illustrated).

Although not illustrated, in some embodiments, a method for making an integrated capacitor structure may include forming a via through the substrate, filling the via with a conductive material, and forming a metal layer on a second side of the substrate and in contact with the conductive material in the via (see, for example, FIG. 5).

In addition, although not illustrated, in some embodiments, a method for making an integrated capacitor structure may include forming one or more additional dielectric layers. For example, a dielectric layer may be formed over the second capacitor plate and/or between the first capacitor plate and the substrate.

Figure 11:
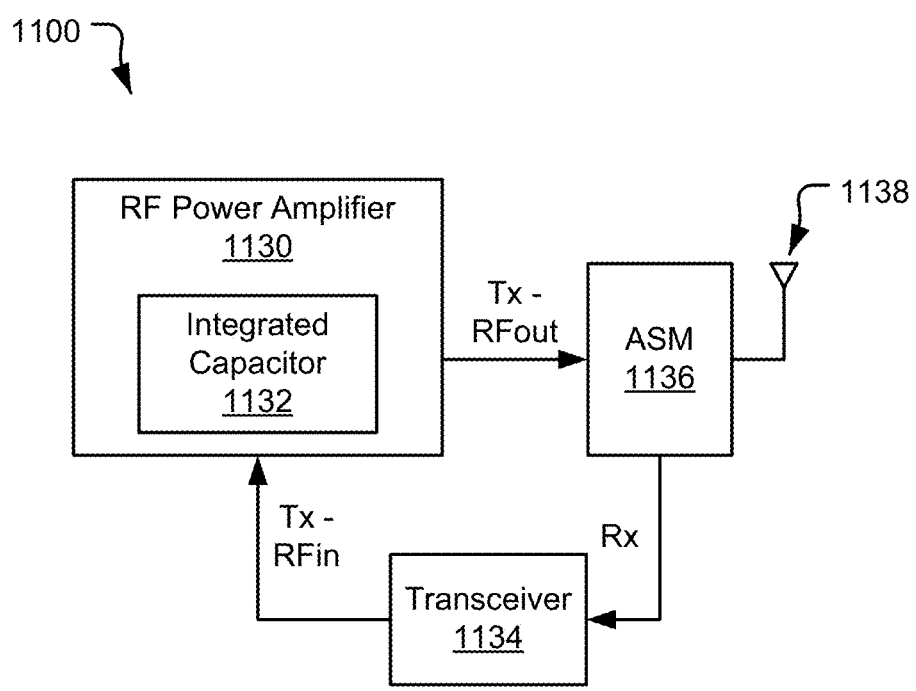
FIG. 11 is a block diagram of a system incorporating a capacitor structure having an overhanging top capacitor plate in accordance with various embodiments.

Embodiments of capacitor structures described herein may be incorporated into various circuits, apparatuses, and systems. A block diagram of an exemplary system 1100 is illustrated in FIG. 11. As illustrated, the system 1100 includes an RF power amplifier 1130 comprising one or more integrated capacitors 1132 including a top capacitor plate overhanging the four edges of a bottom capacitor plate as described herein. The system 1100 may include a transceiver 1134 coupled with the RF power amplifier 1130 as illustrated.

The RF power amplifier 1130 may receive an RF input signal, RFin, from the transceiver 1134. The RF power amplifier 1130 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 11.

The amplified RF output signal, RFout, may be provided to an antenna switch module (ASM) 1136, which effectuates an over the air (OTA) transmission of the RF output signal, RFout, via an antenna structure 1138. The ASM 1136 may also receive RF signals via the antenna structure 1138 and couple the received RF signals, Rx, to the transceiver 1134 along a receive chain.

In various embodiments, the antenna structure 1138 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1100 may be any system including power amplification. In various embodiments, the system 1100 may be particularly useful for power amplification at high radio frequency power and frequency. For example, the system 1100 may be suitable for any one or more of terrestrial and satellite communications, radar systems, and possibly in various industrial and medical applications. Radar applications may include military-use radar, air traffic control, navigation, and the like.

In various embodiments, the system 1100 may be a selected one of a radar device, a satellite communication device, a mobile handset, a cellular telephone base station, a broadcast radio, or a television amplifier system. The system 1100 may find applicability in other applications in which power amplification for high frequency transmission and/or reception is required.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
    a substrate;
    a first capacitor plate having a first surface on a portion of the first capacitor plate opposite the substrate, vertical walls with a height from the substrate, and four square edges defining edges between the first surface and the vertical walls; and
    a second capacitor plate having a second surface that faces the first surface and is larger than and parallel to the first surface, wherein the second capacitor plate includes an overhanging portion around a periphery of the second surface that extends from the second surface toward the substrate, the overhanging portion laterally overlapping at most a portion of the vertical walls of the first capacitor plate that is less than a majority of the height of the vertical walls and defining a recessed portion that is opposite the first surface such that the first capacitor plate is disposed between the recessed portion and the substrate.

2. The apparatus of claim 1, further comprising a dielectric layer between the first capacitor plate and the second capacitor plate.

3. The apparatus of claim 2, wherein the first capacitor plate, the dielectric layer, and the second capacitor plate form a metal-insulator-metal capacitor.

4. The apparatus of claim 2, wherein the second capacitor plate, the dielectric layer, and the substrate encapsulate the first capacitor plate.

5. The apparatus of claim 2, wherein the dielectric layer comprises a first dielectric layer, and further comprising a second dielectric layer between the substrate and the first capacitor plate, and wherein the second capacitor plate, the first dielectric layer, and the second dielectric layer encapsulate the first capacitor plate.

6. The apparatus of claim 1, further comprising a connector connecting the first capacitor plate to a contact pad.

7. The apparatus of claim 1, further comprising a dielectric layer covering the second capacitor plate.

8. The apparatus of claim 7, wherein the dielectric layer includes an opening for electrically connecting to the second capacitor plate.

9. The apparatus of claim 1, wherein the overhanging portion has a bottom surface facing the substrate, and wherein the apparatus further comprises a metal layer on a periphery of the bottom surface of the overhanging portion.

10. The apparatus of claim 9, wherein the metal layer comprises titanium, titanium-tungsten, or nickel.

11. The apparatus of claim 1, wherein the first capacitor plate and the second capacitor plate are disposed on a first side of the substrate, and wherein the apparatus further comprises:
a metal layer on a second side of the substrate; and
a via disposed through the substrate, filled with a conductive material, and connecting the first capacitor plate to the metal layer.

12. A system comprising:
a transceiver to a radio frequency (RF) input signal; and
a radio frequency (RF) power amplifier coupled with the transceiver, to receive the RF input signal from the transceiver, and to output an amplified RF signal, the power amplifier including:
a substrate;
a first capacitor plate having a first surface on a portion of the first capacitor plate opposite the substrate, vertical walls with a height from the substrate, and four square edges defining edges between the first surface and the vertical walls; and
a second capacitor plate having a second surface that faces the first surface and is larger than and parallel to the first surface, wherein the second capacitor plate includes an overhanging portion around a periphery of the second surface that extends from the second surface toward the substrate, the overhanging portion laterally overlapping at most a portion of the vertical walls of the first capacitor plate that is less than a majority of the height of the vertical walls and defining a recessed portion that is opposite the first surface such that the first capacitor plate is disposed between the recessed portion and the substrate.

13. The system of claim 12, further comprising an antenna structure coupled with the power amplifier and configured to facilitate transmission of the amplified RF signal.

14. The system of claim 12, wherein the system is a radar device, a satellite communication device, a mobile handset, a base station, a broadcast radio, or a television amplifier system.

* * * * *